United States Patent
Masumo

(10) Patent No.: US 8,021,711 B2
(45) Date of Patent: Sep. 20, 2011

(54) ORGANIC EL DISPLAY DEVICE AND METHOD FOR FABRICATING THE SAME

(75) Inventor: Kunio Masumo, Yokohama (JP)

(73) Assignee: OPTREX Corporation, Tokyo (JP)

( * ) Notice: Subject to any disclaimer, the term of this patent is extended or adjusted under 35 U.S.C. 154(b) by 1097 days.

(21) Appl. No.: 11/779,541

(22) Filed: Jul. 18, 2007

(65) Prior Publication Data
US 2007/0259588 A1 Nov. 8, 2007

Related U.S. Application Data

(62) Division of application No. 10/900,080, filed on Jul. 28, 2004, now abandoned.

(30) Foreign Application Priority Data

| Jul. 30, 2003 | (JP) | 2003-282344 |
| Nov. 28, 2003 | (JP) | 2003-398762 |
| May 31, 2004 | (JP) | 2004-162506 |

(51) Int. Cl.
*B05D 5/06* (2006.01)
(52) U.S. Cl. ........ 427/66; 427/162; 427/384; 427/397.7
(58) Field of Classification Search ............. 427/66, 427/162, 350, 384, 397.7
See application file for complete search history.

(56) References Cited

U.S. PATENT DOCUMENTS

| 6,181,062 B1 | 1/2001 | Hiraishi et al. |
| 6,309,486 B1 | 10/2001 | Kawaguchi et al. |
| 6,406,802 B1 | 6/2002 | Arai et al. |
| 2001/0043043 A1 | 11/2001 | Aoyama et al. |
| 2002/0050795 A1* | 5/2002 | Imura ............... 315/169.3 |
| 2002/0056842 A1 | 5/2002 | Yamazaki |
| 2002/0164916 A1 | 11/2002 | Nomura et al. |
| 2002/0192576 A1* | 12/2002 | Matsuoka et al. ......... 430/7 |
| 2003/0127651 A1* | 7/2003 | Murakami et al. ........ 257/72 |
| 2003/0213966 A1* | 11/2003 | Yang et al. ............. 257/93 |

(Continued)

FOREIGN PATENT DOCUMENTS

CN 1278660 A 1/2001

(Continued)

OTHER PUBLICATIONS

Office Action mailed Apr. 24, 2007, in Jaopan Patent Application No. 2004-222522, dated Apr. 17, 2007 (with partial English-language Translation).

*Primary Examiner* — James Lin
(74) *Attorney, Agent, or Firm* — Oblon, Spivak, McClelland, Maier & Neustadt, L.L.P.

(57) ABSTRACT

In one mode of the present invention, there is provided an organic EL display device, which includes an organic light emitting layer provided between sets of electrodes, comprising color filters 22 and an overcoat layer 23 provided on a substrate 21; an inorganic solid layer 24 provided on the overcoat layer 23; a first set of transparent electrodes 25 provided on the inorganic solid layer 24; a light emitting layer 27 provided on the first set of electrodes 25; and a second set of electrodes 28 formed on the light emitting layer 27; wherein the inorganic solid layer 24 has routes for moisture passage formed in regions between adjacent electrodes of the first set so as to be uniform over an entire active area.

7 Claims, 6 Drawing Sheets

U.S. PATENT DOCUMENTS

| | | |
|---|---|---|
| 2004/0036410 A1 | 2/2004 | Park et al. |
| 2005/0024339 A1 | 2/2005 | Yamazaki et al. |
| 2006/0039152 A1 | 2/2006 | Ito |

FOREIGN PATENT DOCUMENTS

| | | |
|---|---|---|
| CN | 1380577 A | 11/2002 |
| EP | 1 058 484 A1 | 12/2000 |
| JP | 11-121164 | 4/1999 |
| JP | 11-260562 | 9/1999 |
| JP | 2000-21570 | 1/2000 |
| JP | 2001-60495 | 3/2001 |
| JP | 2003-332069 | 11/2003 |
| WO | WO 03/005461 A1 | 1/2003 |

* cited by examiner

ORGANIC EL DISPLAY DEVICE AND METHOD FOR FABRICATING THE SAME

The present invention relates to an organic electroluminescence (hereinbelow, referred as "organic EL" in Description) display device and a method for fabricating the same.

Research and development have been conducted on display panels forming an organic EL display device (see, e.g., JP-A-2001-60495) on color filters. In order to prevent a minute amount of moisture or a solvent contained in a color filter film from deteriorating an organic EL display device, an inorganic solid layer has been provided between the color filters and the organic EL display device to prevent moisture or an organic substance passing in an interlayer direction.

However, it is impossible for the inorganic solid layer to serve for complete prevention in practice. There has been known a problem that spot-like non-emissive areas are come out with the lapse of time after device fabrication as shown in FIG. 1. FIG. 1 is a schematic plan view showing a state wherein non-emissive areas 2 have been caused in apertural areas (pixels) 1 of a light emitting layer of an organic EL display device. Such spot-like non-emissive areas are a potential cause of visible failure.

As stated earlier, the conventional organic EL display devices have the problem that a display failure is caused with the lapse of time.

The present invention is proposed in consideration of this problem. It is an object of the present invention to provide an organic EL display device and a method for fabricating the same, which are hard to have the occurrence of visible failure caused by the lapse of time or which have no occurrence of the visible failure.

According to a first aspect of the present invention, there is provided an organic EL display device, which includes an organic light emitting layer provided between sets of electrodes, comprising an organic layer provided on a substrate; an inorganic solid layer provided on the organic layer; a first set of transparent electrodes provided on the inorganic solid layer; an organic light emitting layer provided on the first set of electrodes; and a second set of electrodes formed on the organic light emitting layer; wherein the inorganic solid layer has routes for moisture passage formed in regions between adjacent electrodes of the first set so as to be substantially uniform over an entire active area. By this arrangement, it is possible to prevent visible failure from causing in the organic EL display device with the lapse of time.

According to a second aspect of the present invention, there is provided an organic EL display device, which includes a plurality of pixels corresponding to an organic light emitting layer provided between sets of electrodes, comprising an organic layer provided on a substrate; an inorganic solid layer provided on the organic layer; a first set of transparent electrodes provided on the inorganic solid layer; an organic light emitting layer provided on the first set of electrodes; and a second set of electrodes formed on the organic light emitting layer; wherein the inorganic solid layer has routes for moisture passage formed in regions between adjacent electrodes of the first set so as to correspond to substantially all pixels. By this arrangement, it is possible to prevent visible failure from causing in the organic EL display device with the lapse of time.

According to a third aspect of the present invention, the routes for moisture passage are formed at at least one location in each of the regions between adjacent pixels in the organic EL display device referred to in the second aspect.

According to a fourth aspect of the present invention, there is provided an organic EL display device, which includes an organic light emitting layer provided between sets of electrodes, comprising an organic layer provided on a substrate; an inorganic solid layer provided on the organic layer; a first set of transparent electrodes provided on the inorganic solid layer; an organic light emitting layer provided on the first set of electrodes; and a second set of electrodes formed on the organic light emitting layer; wherein the inorganic solid layer has a layer thickness set at such a thickness that allows routes for moisture passage to be formed therein in order to avoid visible failure. By this arrangement, it is possible to prevent visible failure from causing in the organic EL display device with the lapse of time.

According to a fifth aspect of the present invention, there is provided an organic EL display device, which includes an organic light emitting layer provided between sets of electrodes, comprising an organic layer provided on a substrate; an inorganic solid layer provided on the organic layer; a first set of transparent electrodes provided on the inorganic solid layer; an organic light emitting layer provided on the first set of electrodes; and a second set of electrodes formed on the organic light emitting layer; wherein the inorganic solid layer is provided so as to have a layer thickness from 1 to 20 nm in regions between adjacent electrodes of the first set. By this arrangement, it is possible to prevent visible failure from causing in the organic EL display device with the lapse of time.

According to a sixth aspect of the present invention, the inorganic solid layer referred to in the fifth aspect is provided so as to have a layer thickness from 1 to 10 nm in the regions between adjacent electrodes of the first set. It is preferred that the inorganic solid layer is provided so as to have a layer thickness of from 5 to 10 nm.

According to a seventh aspect of the present invention, the inorganic solid layer referred to in the first to sixth aspects is provided so as to have a substantially equal thickness in an active area. By this arrangement, it is possible to avoid visible failure with the lapse of time by a simple process.

According to an eighth aspect of the present invention, the inorganic solid layer referred to in the first to sixth aspects has a greater thickness in regions with the first set of electrodes therein than a thickness in the regions between adjacent electrodes of the first set.

According to a ninth aspect of the present invention, the inorganic solid layer referred to in the first to eighth aspects includes a layer made of silicon oxide. By this arrangement, it is possible to provide the first set of electrode with improved adhesive property.

According to a tenth aspect of the present invention, the inorganic solid layer referred to in the ninth aspect may include a layer made of zirconium oxide provided on the layer made of silicon oxide. By this arrangement, it is possible to minimize the roughness on the surface of the first set of electrodes.

According to an eleventh aspect of the present invention, there is provided a method for fabricating an organic EL display device, comprising providing an organic layer on a substrate; providing an inorganic solid layer on the organic layer; providing a first set of transparent electrodes on the inorganic solid layer; providing an organic light emitting layer on the first set of electrodes; providing a second set of electrodes on the organic light emitting layer provided on the first set of electrodes; and removing water or an organic substance in the organic layer though routes for moisture passage by drying the substrate before providing the organic light emitting layer, the routes for moisture passage being substantially uniformly provided in regions between adjacent electrodes of the first set and in the inorganic solid layer over an entire active area. By this arrangement, it is possible to fabricate an organic EL display device capable of minimizing the occurrence of visible failure with the lapse of time.

According to a twelfth aspect of the present invention, there is provided a method for fabricating an organic EL display device, which includes a plurality of pixels corresponding to an organic light emitting layer provided between sets of electrodes, comprising providing an organic layer on a substrate; providing an inorganic solid layer on the organic layer; providing a first set of transparent electrodes provided on the inorganic solid layer; providing an organic light emitting layer on the first set of electrodes; providing a second set of electrodes formed on the organic light emitting layer provided on the first set of electrodes; and removing water or an organic substance in the organic layer though routes for moisture passage by drying the substrate before providing the organic light emitting layer, the routes for moisture passage being provided in regions between adjacent electrodes of the first set so as to correspond to substantially all pixels. By this arrangement, it is possible to fabricate an organic EL display device capable of minimizing the occurrence of visible failure with the lapse of time.

According to a thirteenth aspect of the present invention, there is provided a method for fabricating an organic EL display device, comprising providing an organic layer on a substrate; providing an inorganic solid layer on the organic layer; providing a first set of transparent electrodes on the inorganic solid layer; providing an organic light emitting layer on the first set of electrodes; and providing a second set of electrodes on the organic light emitting layer provided on the first set of electrodes; and further comprising removing water or an organic substance in the organic layer though routes for moisture passage by drying the substrate before providing the organic light emitting layer, the routes for moisture passage being provided in the inorganic solid layer; and forming the inorganic solid layer so as to have a layer thickness set at such a thickness that allows the routes for moisture passage to be formed therein in order to avoid visible failure when providing of the organic light emitting layer. By this arrangement, it is possible to fabricate an organic EL display device capable of minimizing the occurrence of visible failure with the lapse of time.

According to a fourteenth aspect of the present invention, there is provided a method for fabricating an organic EL display device, which includes a plurality of pixels corresponding to an organic light emitting layer provided between sets of electrodes, comprising providing an organic layer on a substrate; providing an inorganic solid layer on the organic layer; providing a first set of transparent electrodes provided on the inorganic solid layer; providing an organic light emitting layer on the first set of electrodes; and forming the inorganic solid layer so as to have a layer thickness from 1 to 20 nm in regions between adjacent electrodes of the first set when providing of the inorganic solid layer. By this arrangement, it is possible to fabricate an organic EL display device capable of reducing the occurrence of visible failure with the lapse of time.

According to a fifteenth aspect of the present invention, the method referred to in the fourteenth aspect comprises forming the inorganic solid layer so as to have a layer thickness from 1 to 5 nm when providing of the inorganic solid layer.

According to a sixteenth aspect of the present invention, the method referred to in the fifteenth aspect comprises forming the inorganic solid layer at a substrate temperature of 100° C. or below when providing of the inorganic solid layer.

According to a seventeenth aspect of the present invention, the method referred to the fourteenth aspect comprises forming the inorganic solid layer at a substrate temperature of 200° C. or above when providing of the inorganic solid layer.

According to an eighteenth aspect of the present invention, the method referred to in the eleventh to seventeenth aspects further comprises removing at least one part of portions of the inorganic solid layer in the regions between adjacent electrodes of the first set before providing of the organic light emitting layer.

In accordance with the present invention, it is possible to provide an organic EL display device and a method for fabricating the same, which are hard to have the occurrence of visible failure caused by the lapse of time or which have no occurrence of the visible failure.

IN THE DRAWINGS

Figure 1:
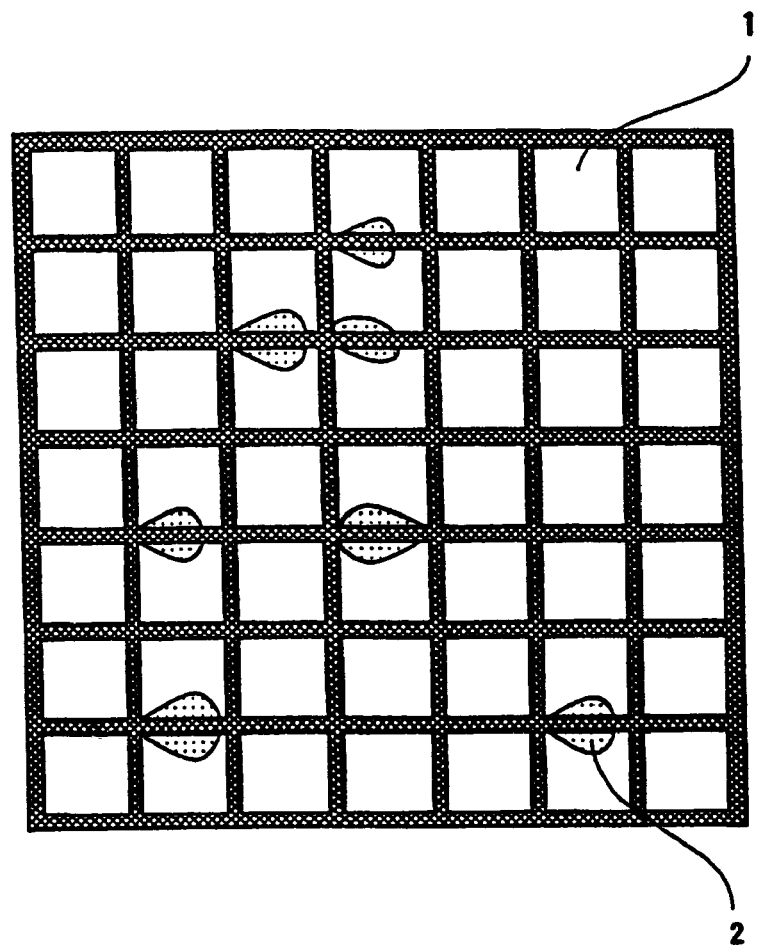
FIG. 1 is a schematic plan view of a conventional organic EL display device.

Now, embodiments of the present invention will be described, referring to examples, the accompanying drawings and the like. The drawings, the examples and the like, and the description are illustrative of the present invention but are not intended to limit the scope of the present invention. It is to be understood that other embodiments are included within the scope of the present invention as long as they fall within the spirit of the present invention. In the drawings, like reference numerals designate identical or corresponding parts.

An organic EL display device is configured in a multi-layered structure wherein, as an example, color filters are provided on a substrate, an overcoat layer is formed on the color filters and the substrate for flatness, an inorganic solid layer is formed on the overcoat layer to prevent moisture or an organic substance from passing in an interlayer direction, a first set of transparent electrodes is provided on the inorganic solid layer, a second set of electrodes is provided above the first set of transparent electrodes (a side of the first set of electrodes remote from the substrate), and an insulating layer with apertural areas formed therein and a light emitting layer are provided between the first set of electrodes and the second set of electrodes.

Figure 2:
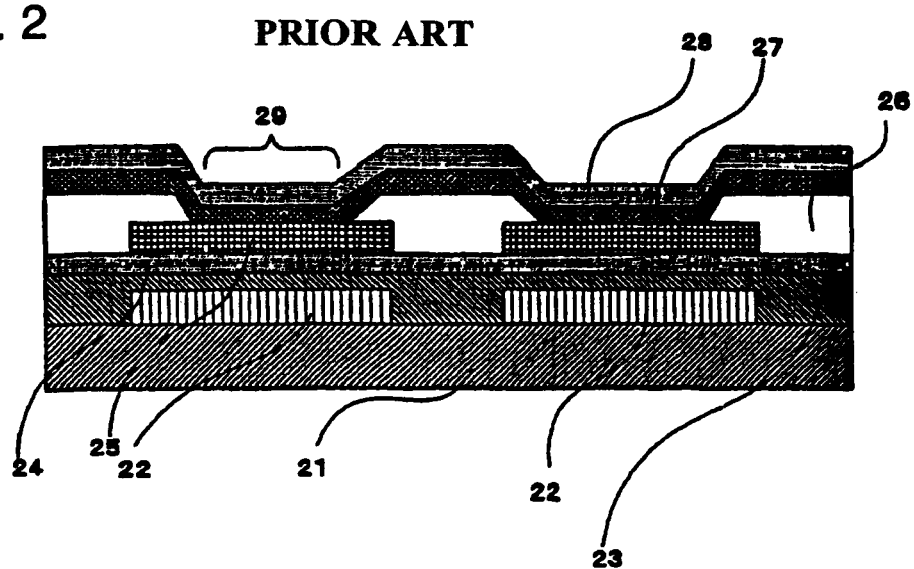
FIG. 2 is a schematic cross-sectional view of the conventional organic EL display device.

This structure will be illustratively described, referring to FIG. 2. The color filters 22, such as red color filters, blue color filters and green color filters, are provided on the substrate 21. The overcoat layer 23 is provided so as to cover the color filters to form a flat surface. The inorganic solid layer 24 is provided on the overcoat layer. The first set of patterned electrodes 25 is provided on the inorganic solid layer. The insulating layer 26 with the apertural areas 29 formed therein, the light emitting layer 27 and the second set of electrodes 28 are provided on the first set of electrodes. The multi-layered structure of the organic EL display device is configured in this way. In general, the first set of electrodes is used as anodes, and the second set of electrodes is used as cathodes. In the structure stated earlier, the word "on" means not only that a layer or the like is directly provided on another layer or a set of electrodes, but also that a layer or the like is provided on another layer or a set of electrodes with another layer or the like interposed therebetween. In other words, another layer may be formed between layers or between a layer and a set of electrodes.

The organic EL display device is usually driven by passive matrix addressing, using the first set of transparent electrodes as signal electrodes and the second set of electrodes as scanning electrodes. This is because this type of structure can be easily fabricated. Conversely, the first set of transparent electrodes may be used as scanning electrodes, and the second set of electrodes may be used as signal electrodes. The first set of electrodes and the second set of electrodes may be respectively formed as scanning electrodes and signal electrodes, which are connected to TFTs (thin film transistors).

The color filters and the overcoat layer are layers made of an organic material (organic layers) and are liable to hold water or an organic substance, such as an organic solvent. In some cases, good film formation of the first set of electrodes is inhibited by water or an organic substance, which is generated from an organic layer when the first set of electrodes is fabricated by, e.g. sputtering. It has been known that the water or the organic substance diffuses in the light emitting layer provided on the first set of electrodes to disturb light emission.

In order to prevent the water or the organic substance from diffusing, the formation of the first set of electrodes has been performed so that the inorganic solid layer, which is made of, e.g., silicon oxide, is provided under the first set of electrodes. When the first set of electrodes is provided directly on the organic layer, it is difficult to obtain a sufficient adhesive force between the overcoat layer and the first set of electrodes in many cases. The provision of the inorganic solid layer can solve this problem as well.

However, the inorganic solid layer is susceptible to the formation of a pinhole. When a pinhole is formed, water or an organic substance contained in the organic layers passes through the pinhole to disturb light emission in the light emitting layer. The first set of electrodes is normally formed in a pattern having a plurality of stripes. When the pinhole in the inorganic solid layer exists in a region with a patterned stripe, it is possible to prevent the movement of the water or the organic substance by the first set of electrodes. However, when the pinhole is in a region without a patterned stripe, it is impossible to inhibit the movement of the water or the organic substance.

Figure 4:
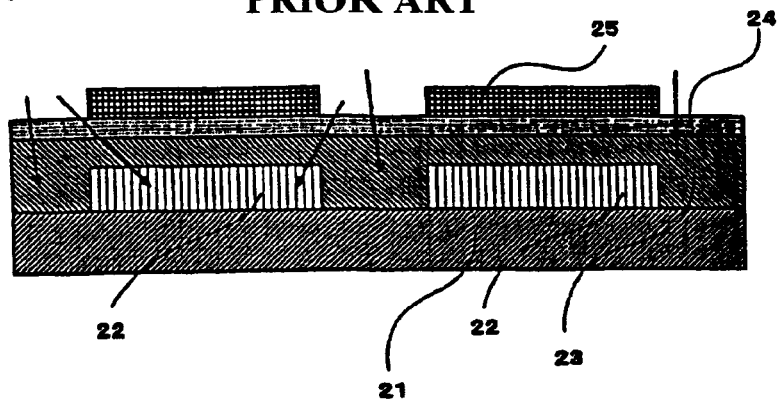
FIG. 4 is a cross-sectional view of the conventional organic EL display device, schematically showing a state wherein water or an organic substance enters color filters or an overcoat layer.

Even if the organic layers can be dried to completely remove water or an organic substance before formation the inorganic solid layer, water or an organic substance, which has been used during fabrication of the organic EL display device, enters a color filter or the overcoat layer through pinholes in the inorganic solid layer as indicated by arrows in FIG. 4. This sort of trouble is caused at the time of washing the first set of electrodes patterned by etching, taking off a photoresist in a photolithographic treatment, developing the insulating layer or washing the developed insulating layer.

Figure 5:
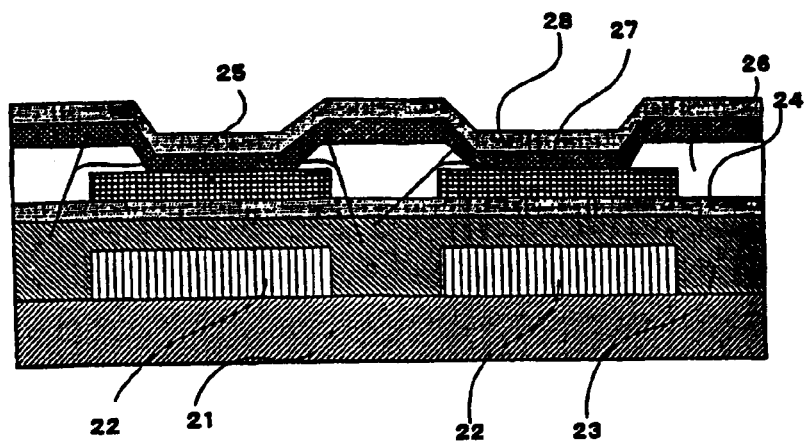
FIG. 5 is a cross-sectional view of the conventional organic EL display device, schematically showing a state wherein water or an organic substance enters from the color filters or the overcoat layer into an upper layer.

Even if a drying treatment is performed on a later stage, the water or the organic substance, which has entered the color filter or the overcoat layer, is insufficiently removed since there is no other escape than the pinholes. After the organic EL display device is finished, the water or the organic substance enters the light emitting layer through the pinholes as indicated by arrows in FIG. 5 to suppress light emission, causing non-emissive areas.

The visible failure with the lapse of time stated earlier is supposed to be caused by this mechanism. FIG. 4 shows a cross-sectional structure when no layer is provided on a side of the first set of electrodes remote from the substrate. However, a similar problem is caused in a structure wherein another layer is provided on the side of the first set of electrodes remote from the substrate.

In other words, in the case of an organic EL display device wherein a first set of transparent electrodes is provided on a substrate, a second set of electrodes is provided on a side of the first set of electrodes remote from the substrate, a light emitting layer is provided between the first set of electrodes and the second set of electrodes, an organic layer is provided between the first set of electrodes and the substrate, and an inorganic solid layer is provided between the first set of electrodes and the organic layer to prevent water or an organic substance from passing in an interlayer direction, when a pinhole exists in the inorganic solid layer, spot-like non-emissive areas are formed with the lapse of time as show in FIG. 1, causing visible failure. Although, as one of the measures, there is a proposal to increase the thickness of the inorganic solid layer, it is difficult to completely eliminate the formation of the pinholes by this proposal. An increase in the thickness also causes a problem, such as an increase in production costs.

The problem of visible failure can be solved by providing the inorganic solid layer so as to have a layer thickness from 0 to 5 nm between the first set of electrodes and the organic layer and in at least a portion of each of regions without a patterned electrode of the first set. By adopting this solution, it is possible to fabricate an organic EL display device, wherein visible failure with the lapse of time is not caused or is difficult to be caused.

Figure 3:
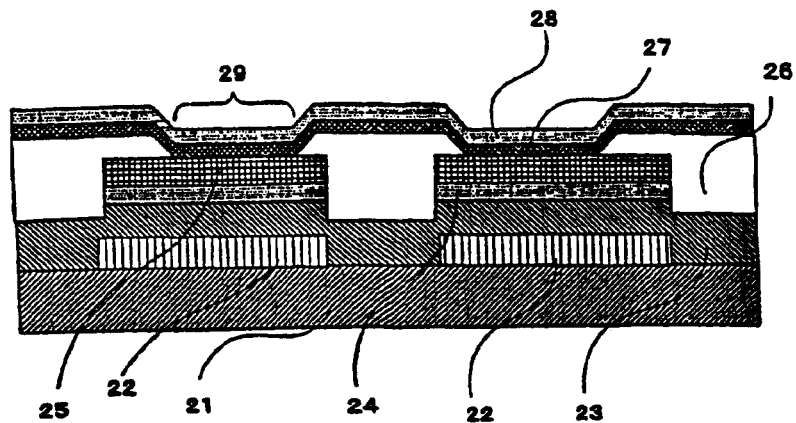
FIG. 3 is a schematic cross-sectional view of the organic EL display device according to an embodiment of the present invention.
Figure 11:
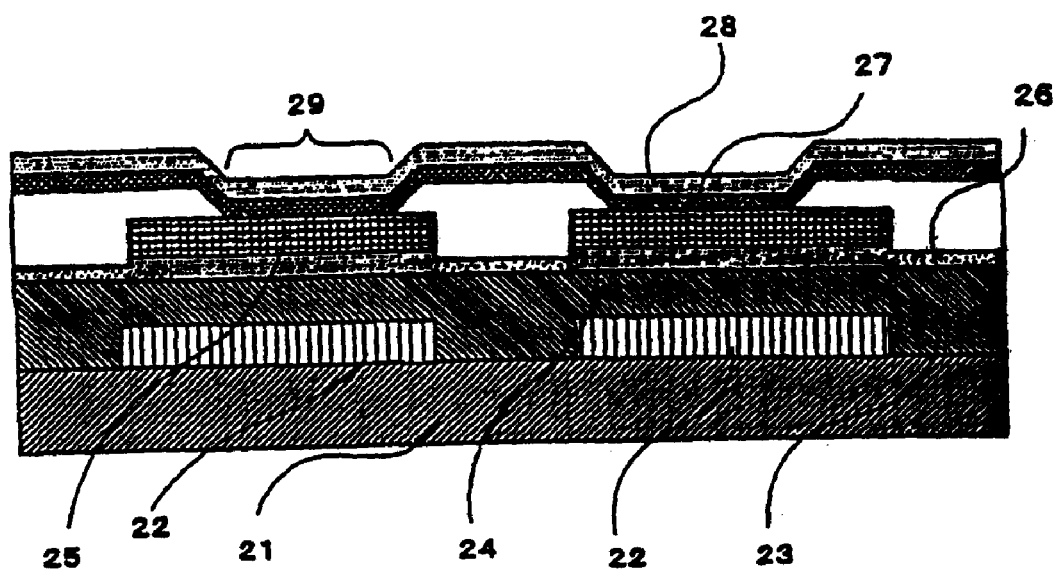
FIG. 11 is a schematic cross-sectional view of the organic EL display device according to an embodiment of the present invention.

The structure of an organic EL display device with this solution applied thereto will be described, referring to FIG. 3. This figure is a schematic cross-sectional view of an organic EL display device according to the present invention. Color filters 22, such as red color filters, blue color filters or green color filters, are provided on a substrate 21, an overcoat layer 23 is provided to cover the color filters so as to form a flat surface, an inorganic solid layer 24 is provided on the overcoat layer, a first set of patterned electrodes 25 are provided on the inorganic solid layer, and an insulating layer 26, a light emitting layer 27 and a second set of electrodes 28 are provided on the first set of electrodes. Although the multi-layered structure of the organic EL display device is configured in this way, this figure illustratively shows that the inorganic solid layer has a layer thickness of 0 nm in regions without any one of the first set of electrodes provided therein (hereinbelow, referred as "the pattern spacings" or "the first electrode spacings" in some cases) since, when patterning the first set of electrodes after having been formed as a uniform layer, spacings between adjacent electrodes, portions of the inorganic solid layer under the spacings, and portions of the overcoat layer under the portions of the inorganic solid layer are removed by etching. In the present invention, a case wherein the inorganic solid layer is formed so as to have a layer thickness of 0 nm includes a case wherein the inorganic solid layer is not formed in all regions without any one of the first set of electrodes provided therein. Additionally, a case wherein the inorganic solid layer 24 has a layer thickness of more than 0 nm is shown in FIG. 11.

By the provision of the inorganic solid layer 24, it is possible to prevent water or an organic substance from diffusing from the color filters 22 and the overcoat layer 23 onto the inorganic solid layer 24 when fabricating the first set of electrodes. Thus, it is possible to ensure an adhesive force between the first set of electrodes 25 and the inorganic solid layer 24.

Figure 6:
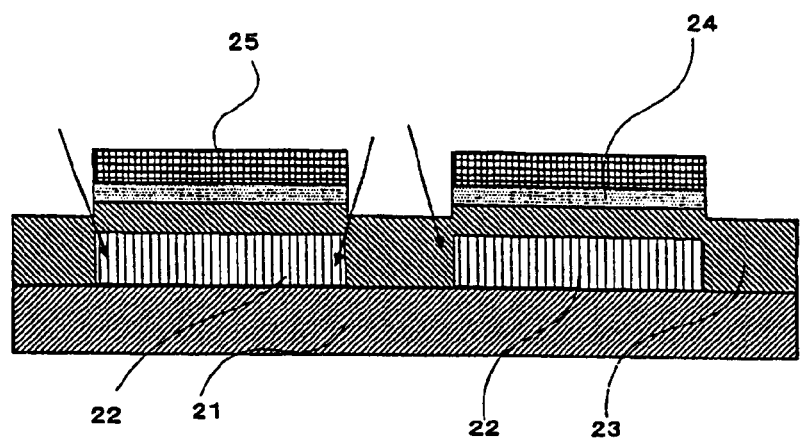
FIG. 6 is a cross-sectional view of the organic EL display device according to the embodiment, schematically showing a state wherein water or an organic substance enters color filters or an overcoat layer.
Figure 7:
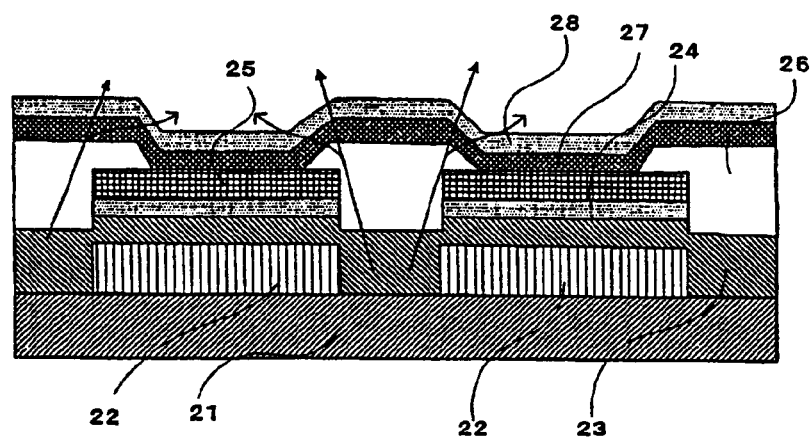
FIG. 7 is a cross-sectional view of the organic EL display device according to the embodiment, schematically showing a state wherein water or an organic substance is removed from the color filters or the overcoat layer.

Although water or an organic substance that has been used when fabricating the respective layers after formation of the first set of electrodes is likely to diffuse into the color filters 22 and the overcoat layer 23 as indicated by arrows in FIG. 6 since the portions of the inorganic solid layer in the inter-patterns of the first electrode spacings is removed, it is possible to easily remove the water or the organic substance by, e.g., drying at a later stage as indicated by arrows in FIG. 7. Although FIG. 6 shows, as in FIG. 4, a cross-sectional structure when no other layer is not formed on the side of the first set of electrodes remote from the substrate, the same holds for a structure wherein another layer has been formed on the side of the first set of electrodes remote from the substrate.

Accordingly, it is possible to prevent the occurrence of visible failure with the lapse of time by sufficiently removing the water or the organic substance of the organic EL display device when finally sealing of the organic EL display device. Although FIG. 7 shows a stage wherein the light emitting layer 27 and the second set of electrodes 28 have been formed, the time for removing water or an organic substance is not limited to this stage. The removal of water or an organic substance may be performed one or more times at an arbitrary stage up to final sealing of the organic EL display device.

The inorganic solid layer does not necessarily need to have a film thickness of 0 nm in the first electrode spacings. It is sufficient that the inorganic solid layer has a layer thickness in a range from 0 to 5 nm in the first electrode spacings. This is because, even if the layer thickness is not 0 nm, it is possible to remove water or an organic substance when the inorganic solid layer is quite thin. For example, when the layer thickness is not greater than about 2 nm, regions without the inorganic solid layer are partly formed since it is difficult to obtain uniform film deposition. The layer thickness of the inorganic solid layer referred to here is an average value.

In many cases, it is preferred that the inorganic solid layer has a layer thickness from 0.5 to 5 nm in the first electrode spacings. This is because it is possible not only to prevent water or an organic substance from entering but also to remove water or an organic substance through the inorganic solid layer.

In consideration of the process tolerance of exposed portions of the inorganic solid layer against, e.g., acids, alkalis, organic solvents, plasma or a brush, a thicker layer of the inorganic solid layer is preferred on condition that the inorganic solid layer has a thickness in a range capable of maintaining water permeability. In some cases, it is preferred that the inorganic solid layer has a layer thickness from 5 to 10 nm in consideration of the film deposition conditions of the inorganic solid layer and the drying conditions before vapor deposition of the device.

For example, in the case of depositing a film of $SiO_2$ as the inorganic solid layer by sputtering, when the film deposition is performed at a substrate temperature from 200 to 230° C., it is possible to obtain sufficiently high water permeability even if the layer thickness is about 10 nm. As stated earlier, from the viewpoint of the process tolerance, it is preferred that the inorganic solid layer has a greater layer thickness. In this case, it was possible to obtain good results by forming the inorganic solid layer so as to have a layer thickness from 5 to 10 nm and performing a heating and drying process at 200 to 250° C. as the drying process before vapor deposition of the device.

Likewise, in a case wherein the inorganic solid layer is made of a film of $SiO_2$ deposited by sputtering at a substrate temperature of 100° C. or below, it is seen that the water permeability is insufficient at a layer thickness of 10 nm. In this case, it is sufficient that the inorganic solid layer has a layer thickness of 1 to 5 nm.

In the present invention, in order to prevent water or an organic substance from entering an organic layer before provision of the first set of electrodes, it is preferred that the inorganic solid layer is provided so as to have a layer thickness of 0 to 20 nm on a side of the first set of electrodes close to the substrate. The inorganic solid layer may be fabricated as a single layer along with the inorganic solid layer in each of the pattern spacings or be fabricated separately from the inorganic solid layer in each of the pattern spacings. Although all portions of the inorganic solid layer does not need to exist on the same plane as each other, the inorganic solid layer is provided between an organic layer and the first set of electrodes in order to prevent water or an organic substance from entering the organic layer. When the inorganic solid layer is fabricated as the single layer, the inorganic solid layer has a layer thickness from 0 to 5 nm in each of the pattern spacings of the first set of electrodes, and the inorganic solid layer has a layer thickness from 0 to 20 nm in the regions with the first patterned electrodes (hereinbelow, referred to as "under the first patterned electrodes" in some cases).

The inorganic solid layer may also have a layer thickness from 0 to 5 nm in the regions with the first patterned electrodes provided there.

Figure 8A:
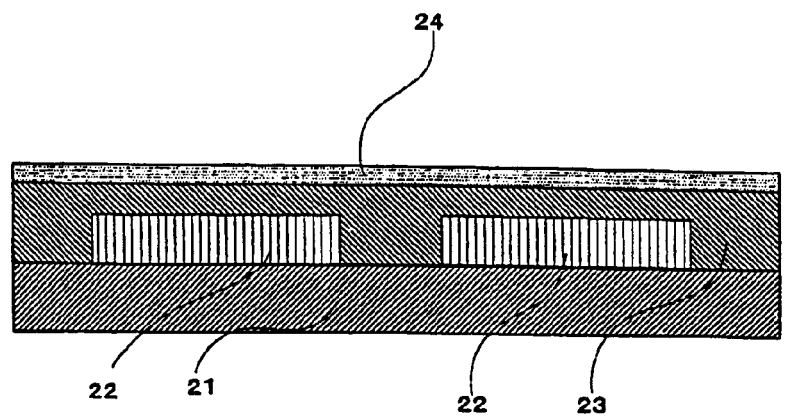
FIGS. 8A and 8B are a cross-sectional views of the organic EL display device according to an embodiment of the present invention, schematically showing a state wherein after an inorganic solid layer was once formed so as to have a thickness beyond 5 nm, the portions of the inorganic solid layer between first patterned electrodes are removed by etching.
Figure 8B:
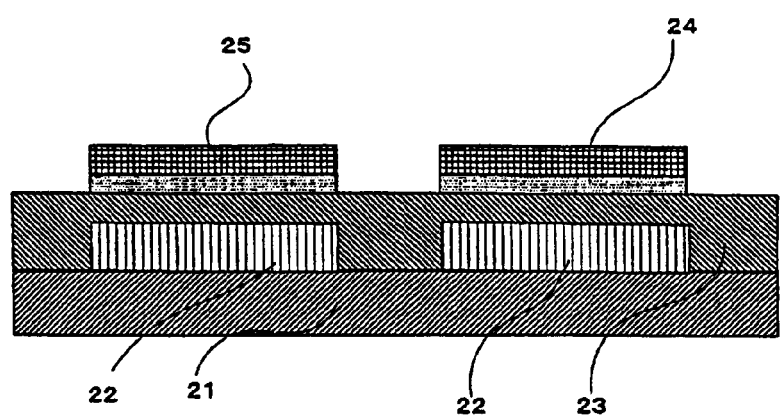

As a case wherein the inorganic solid layer does not have a thin layer thickness in a range from 0 to 5 nm under the first patterned electrodes, there is an example wherein the inorganic solid layer is once deposited so as to have a layer thickness beyond 5 nm as shown in FIG. 8A, and then the portions of the inorganic solid layer in the patterned spacings of the first electrodes are etched so as to have a layer thickness in the range from 0 to 5 nm as shown in FIG. 8B. Or the portions of the inorganic solid layer in the pattern spacings of the first electrodes may be removed by polishing the substrate surface after deposition of the first set of electrodes. In the latter case, the total thickness decreases since the surfaces of the first set of electrodes are also polished. FIG. 8B shows a case wherein the portions of the inorganic solid layer between adjacent patterned electrodes are all removed. A case wherein the portions of the inorganic solid layer between adjacent patterned electrodes remain so as to have a layer thickness in the range from 0 to 5 nm, or a case wherein the portions of the overcoat layer between adjacent patterned electrodes are also removed as shown in FIG. 3 are included with the scope of the present invention.

As a case wherein the inorganic solid layer has a layer thickness of 5 nm or below under the first patterned electrodes, there is an example wherein the inorganic solid layer 24 shown in FIG. 2 is deposited so as to have a layer thickness of 5 nm or below from the start. In this case, although there is no need for etching since the inorganic solid layer has already had a layer thickness in the range from 0 to 5 nm in the pattern spacings of the first electrodes, etching may be further performed for easy removal of water or an organic substance.

It should be understood that one of the features of the present invention that the inorganic solid layer has a layer thickness from 0 to 5 nm in the pattern spacings of the first electrodes is not limited to the cases stated earlier. A case wherein the portions of the inorganic solid layer under the first patterned electrodes partly have a layer thickness in the range from 0 to 5 nm, and a case wherein the portions of the inorganic solid layer in the pattern spacings partly have a layer thickness in the range from 0 to 5 nm are also included within the scope of the present invention. A specific preferred range for the layer thickness or specific preferred portions of the inorganic solid layer to have a layer thickness in the range from 0 to 5 nm may be easily determined by performing a model experiment or the like and reviewing whether the occurrence of visible failure with the lapse of time can be avoided or not.

The advantage stated earlier may be regarded as being an advantage offered by a feature that the layer thickness of the inorganic solid layer in each of the pattern spacings of the first electrodes is smaller than that under each of the first patterned electrodes. In other words, it is possible to avoid difficulty in fabrication of the first set of electrodes and to easily remove water or an organic substance at a later stage by adding a process wherein, after the inorganic solid layer has been once deposited, the inorganic solid layer is processed so that the layer thickness of the inorganic solid layer in each of the pattern spacings is smaller than the layer thickness of the inorganic solid layer under each of the first patterned electrodes. The layer thickness in this case may be determined by an average value.

Strictly speaking, the layer thickness of the portions of the inorganic solid layer in the first electrode spacings is smaller than the layer thickness of the portions of the inorganic solid layer at each of the intersections with the second set of electrodes among the portions of the inorganic solid layer under the first patterned electrodes, when seeing the organic EL display device from a direction perpendicular to the substrate surface.

Such a structure may be obtained by preliminarily depositing the inorganic solid layer so as to be at least partly formed at the intersections between the first set of electrodes and the second set of electrodes, and pattering the first set of electrodes, followed by etching the portions of the inorganic solid layer corresponding to the regions without the first patterned electrodes. Or the portions of the inorganic solid layer corresponding to the regions without the first patterned electrodes may be removed by polishing the substrate surface.

Although any conventional method is applicable as a method for processing the portions of the inorganic solid layer in the pattern spacings so as to have a layer thickness from 0 to 5 nm, the most rational method is to etch the portions of the inorganic solid layer corresponding to the regions without the first patterned electrodes after patterning the first set of electrodes. Etching may be dry etching or wet etching, or a combination of both. Although the portions of the inorganic solid layer under the first patterned electrodes are partly etched to form undercuts in some cases, no problem is caused as long as the formed undercuts can be filled with, e.g., an insulating layer.

Or it is acceptable to remove the portions of the inorganic solid layer in the regions of the first electrode spacings by polishing the substrate surface after deposition of the first set of electrodes. In this case, it is possible to minimize the roughness of the surfaces of the first set of electrodes since not only the organic layer in the regions of the first electrode spacings but also the surfaces of the first set of electrodes are removed by polishing. In this case, in consideration of a decrease in the thickness of the first set of electrodes, it is preferred that the first set of electrodes are deposited so as to have a greater film thickness than desired.

The layer thickness of the portions of the inorganic solid layer in the first electrode spacings, which is appropriate for drying and removing of water or the like, is not limited to a value in the range stated earlier. For example, the layer thickness appropriate for drying and removing varies since the film quality of the inorganic solid layer varies depending on the conditions of film deposition of the inorganic solid layer and the first set of electrodes. Specifically, when the film deposition temperature for each of the inorganic solid layer and the first set of electrodes is high, even a layer thickness beyond 5 nm is appropriate for drying and removing moisture. On the other hand, when the film deposition temperature for each of the inorganic solid layer and the first set of electrodes is low, there is a tendency that even a layer thickness below 5 nm is appropriate for drying and removing moisture. The inorganic solid layer and the first set of electrodes are normally deposited at substantially the same temperature since both are deposited by the same sputtering system.

For example, when the film deposition temperature is as high as about 200° C., it is preferred that the portions of the inorganic solid layer in the first electrode spacings has a layer thickness from 0 to 20 nm. For example, when the first set of electrodes is made of ITO, a polycrystal layer of ITO is formed by film deposition at a temperature of 200° C. or higher. On the other hand, when the film deposition temperature is as low as 100° C. or below, it is preferred that the layer thickness is smaller than 5 nm. When film deposition is performed at a temperature of 100° C. or below, an amorphous layer of ITO is formed. From the viewpoint of durability at a later process, it is recommended that the layer thickness of the inorganic solid layer is set at 1 nm or greater. The inorganic solid layer thus formed is appropriate for drying and removing moisture or an organic substance in an organic layer. The inorganic solid layer may be formed so as to have a layer thickness in the range stated earlier by film deposition or be formed by being partly removed by, e.g., etching after having formed so as to have a greater film thickness than the film thicknesses stated earlier.

The inorganic solid layer that is appropriate for drying and removing has routes for moisture passage formed therein to pass water or an organic substance in an organic layer from the organic layer to an upper layer in the drying process. The routes for moisture passage are routes, through which moisture or an organic substance contained in the color filter 22 or the overcoat layer 23 passes through the inorganic solid layer in the drying process. In the other words, moisture or the like in an organic layer can be removed through the routes for moisture passage formed in the inorganic solid layer since moisture or the like is movable between layers through the routes for moisture passage in the drying process. When the drying process is performed after formation of the first set of electrodes, moisture or the like is removed through the routes for moisture passage formed in the first electrode spacings.

It is recommended that the routes for moisture passage are uniformly formed in the inorganic solid layer over the entire active area. When the drying process is performed after formation the first set of electrodes, it is recommended that the routes for moisture passage are uniformly formed in the pattern spacings of the first electrodes. When the routes for moisture passage fail to be uniformly formed with a certain density or more, it is impossible to remove moisture or the like in an organic layer in a sufficient way. As a result, it is observed that spot-like non-emissive areas are formed in portions without the routes for moisture passage as shown in FIG. 1.

It is recommended that the inorganic solid layer has the routes for moisture passage formed so as to correspond to all pixels comprising the portions of the organic light emitting layer formed between the first and second sets of electrodes. Specifically, when the pixels are formed in a matrix pattern as shown in FIG. 1, it is recommended that each of the pixels has at least one route for moisture passage formed in a peripheral region thereof (a region between the pixel and an adjacent pixel). It is recommended that each of the pixels has one or more routes for moisture passage formed in the region between the pixel and an adjacent pixel. Since the moisture or the like in the organic layers can be fully removed by this arrangement, it is possible to avoid the occurrence of visible failure with respect to all pixels.

In order to determine whether the routes for moisture passage, which are appropriate for removal of water or the like in the drying process, have been formed in the inorganic solid layer, the substrate is put in a vacuum chamber and is heated therein for instance. When the routes for moisture passage have been formed in a sufficient way, an increase in the pressure in the chamber is observed since the moisture or the like leaks out through the routes for moisture passage. In other words, when the pressure in the chamber increases, it is verified that the routes for moisture passage have been formed in the inorganic solid layer in a sufficient way, and that the routes for moisture passage are appropriate for drying and removing. On the other hand, when the pressure in the chamber does not increase, it is verified that the routes for moisture passage are not appropriate for drying and removing since the routes for moisture passage have been formed in the inorganic solid layer in an insufficient way, and since the routes for moisture passage cannot remove the moisture or the like in a sufficient way. Thus, it is possible to determine whether the routes for moisture passage have been formed so as to be appropriate for drying and removing.

The inorganic solid layer, the thickness of which is as extremely small as a few nm, may be deposited by lowering the power supply for film deposition or reducing the time period for film deposition. For example, it is possible to form the inorganic solid layer as a thin layer by increasing the conveying speed for the substrate to reduce the time period for film deposition in an in-line sputtering system wherein the substance is subjected to film deposition, being conveyed. For example, the film deposition may be performed while the conveying speed is modified based on the ratio of a desired film thickness of the extremely thin layer to be actually deposited to a film thickness to be able to be accurately measured. By this arrangement, it is possible to reduce the time period for film deposition and to uniformly form the inorganic solid layer as an extremely thin layer.

The film thickness of the inorganic solid layer, which is formed as an extremely thin layer by the method stated below, may be measured by a stylus method film thickness meter. A sample wherein an organic layer, an inorganic solid layer and a transparent electrode pattern are provided in layers, is used. The inorganic solid layer is etched, using the transparent electrode pattern as a mask. When the transparent electrodes is made of a film of ITO, and when the inorganic solid layer is made of a film of $SiO_2$, only the film of $SiO_2$ is etched away, and the organic film as the lower layer is prevented to be etched by using dilute hydrofluoric acid as the etchant.

After that, the film of ITO is etched away. Thus, the patterned film of $SiO_2$ remains on the organic film. The film of $SiO_2$ is measured by the stylus method film thickness meter. It is normally difficult to measure a step from 1 to 10 nm with good precision by the stylus method film thickness meter. However, when a pattern for matrix elements of an organic EL display device is used as the transparent electrode pattern, it is possible to periodically measure a plurality of steps by the stylus method film thickness meter since the steps are formed with a high density.

As a result, it is easy to distinguish between noise and a step, and it is possible to improve measurement precision. Thus, it is possible to measure a step having a difference of about 3 nm or more with good reproducibility.

As the inorganic solid layer according to the present invention, a material that has a function to prevent water or an organic substance from diffusing is employed. Any inorganic material, which preferably has a good adhesion property with respect to the first set of electrodes, is applicable. Examples of preferred inorganic compounds are silicon oxide ($SiO_2$), zirconium oxide ($ZrO_2$), silicon nitride (SiNx), silicon oxynitride (SiOxNy), tantalum oxide (TaOx) and aluminum oxide (AlOx). A film of silicon oxide is particularly preferred. The inorganic solid layer may be deposited by a conventional method, such as sputtering. The inorganic solid layer may comprise a plurality of layers made of different materials. When the inorganic solid layer comprises a plurality of layers, it is preferred that the inorganic solid layer includes a film of silicon oxide. Additionally, when the inorganic solid layer has a multilayered structure, it is recommended that a film of zirconium oxide be formed on a film of silicon oxide. By this arrangement, it is possible to reduce the roughness of the surfaces of the first set of electrodes formed on the inorganic solid layer. The layer of zirconium oxide may be deposited by a sputtering process wherein a target of zirconium and an oxygen gas are employed.

The substrate to be employed in the present invention is a supporter for the organic EL display device. A transparent substrate, such as a glass sheet or a plastic film, is applicable in general. More specifically, a soda lime glass substrate with an alkali barrier or a non-alkali glass substrate is applicable in many cases. A plastic substrate with a moisture-proof coating is applicable. Examples of the plastic material are polycarbonate, polymetacrylate and polysulfone.

As the material for the first set of electrodes, a thin film of indium tin oxide (ITO) or a film of tin oxide is applicable. The first set of electrodes may comprise a metal having a high work function, such as silver or gold, a conductive inorganic material, such as copper iodide, or a conductive polymer, such as poly(3-methylthiophene), polypyrrole or polyaniline. Although the layer thickness of the first set of electrodes is determined depending on required transparency, the layer thickness is generally from 5 to 1000 nm, preferably from 10 to 500 nm since the transmittance ratio of visible light is set at 60% or higher, preferably 80% or higher. In the case of metal electrodes, Al or Cr or the like is applicable.

As the material for the second set of electrodes, various electrode materials including electrode materials for the conventional organic EL are applicable. Examples of the electrode materials are an alloy of magnesium and aluminum, an alloy of magnesium and silver, an alloy of magnesium and indium, an alloy of aluminum and lithium, and aluminum.

As the material for the light emitting layer, a chemical compound, which has a high fluorescence yield, a high injection efficiency to electrons from the second set of electrodes, and a high electron mobility, is effective. As such a chemical compound, a known organic substance having a light emitting property, such as 8-oxyquinoline complex, tetraphenylbutadiene, styryl dye and oxadiazole dye, is applicable.

The thickness of the light emitting layer is normally from 10 to 200 nm, preferably from 20 to 80 nm. The light emitting layer may be accompanied by a hole transport layer, an interface layer, an electron injection layer, an electron transport layer or the like. When any one of these layers exists, the light emitting layer according to the present invention is construed as one which includes the layers.

As the organic layers according to the present invention, any layer containing an organic composition may be included. In other words, the organic layers are layers, which comprise a substance capable of containing water or an organic substance. Examples of the organic layers are the color filters, a color conversion layer, a transparent film for interference control, the overcoat layer and a black matrix. The present invention is particularly preferred in practice when the color filters and the overcoat layer are included as the organic layers.

It is preferred that the organic EL display device according to the present invention further includes an insulating layer having apertural areas corresponding to the intersections between the first set of electrodes and the second set of electrodes in order to delimit pixels for display.

As the material for forming the overcoat layer or the insulating layer, a polymeric material, such as a polyimide resin, is particularly applicable. There is no limitation to the material. A known material having a sufficient insulating property is applicable. However, the overcoat layer needs to be transparent in order to make the light emitting parts visible from outside. As the method for forming the overcoat layer or the insulating layer, a known method is applicable.

In accordance with a method for fabricating the organic EL display device according to the present invention, a first set of transparent electrodes are provided on a substrate, a second set of electrodes are provided on a side of the first set of electrodes remote from the substrate, a light emitting layer is formed so as to be located between a layer of the first set of electrodes and a layer of the second set of electrodes, an organic layer is formed between the first set of electrodes and the substrate, and an inorganic solid layer for, which is capable of preventing water or an organic substance from passing in an interlayer direction, is provided so as to have a layer thickness from 0 to 5 nm so that the inorganic solid layer is located between the layer of the first set of electrodes and the organic layer, and in at least one portion of each of regions without the patterned electrodes of the first electrodes. Then, water or an organic substance is removed. The removal of water or an organic substance means a reduction in the mass of water or an organic substance contained, and does not necessarily means the nonexistence of water or an organic substance.

As stated earlier, the removal of water or an organic substance may be performed one or more times at an arbitrary stage up to a stage wherein a display area comprising collection of pixels is sealed to finally seal the organic EL display device. The removal is preferably performed before formation of the second set of electrodes. This is because, after formation of the second electrodes, the second electrodes works as a barrier to deteriorate the removal efficiency of water or an organic substance in many cases. The removal is more preferably performed before formation of the organic film as the light emitting element layer. This is because in many cases, it is difficult to perform drying by heating after formation of the organic film. Specifically, when the removal is performed may be determined, depending on the fabrication processes of an actual organic EL display device.

The removal of water or an organic substance is preferably performed by a drying treatment. The drying treatment may be performed in any drying mode, such heating, introduction of a dry gas, or depressurization. The drying treatment may be performed in a combination of modes.

More specifically, it is preferred in terms of simplification and high reliability that the drying treatment is performed by heating in a dry atmosphere using introduction of a dry gas or in depressurization. In this case, the degree of depressurization may be appropriately selected. To replace an atmosphere by a dry gas before depressurization is effective. As the dry gas, dry air, a nitrogen gas, an argon gas or the like is applicable. It is preferred that the drying treatment is performed before formation of the light emitting layer. It is preferred from the viewpoint of the time period required for process treatment that the drying treatment is performed by depressurization and heating.

It is preferred that required treatments are performed in an environment of a drying gas of atmospheric pressure or a drying gas of decompressed pressure up to sealing of the display area after removal of water or an organic substance by the drying treatment or the like. As the dry gas, dry air, a nitrogen gas, an argon gas or the like is applicable.

When the display area is sealed to complete the organic EL display device according to the present invention, it is preferred from the viewpoint of avoiding aged deterioration by invasion of external air to perform the sealing in an atmosphere of a dry gas. As the dry gas, it is preferred to employ a gas inactive against the employed materials, such as a nitrogen gas, or an argon gas.

Thus, the organic EL display device according to the present invention is provided as an electronic device, which is capable of avoiding the occurrence of display failure with the lapse of time or making the occurrence of display failure difficult. In other words, the organic EL display device can maintain the initial display properties at substantially the same level.

The present invention has been mainly described in about a case wherein the inorganic solid layer exists under each of the first patterned electrodes. When the inorganic solid layer, which disturbs the diffusion of water or an organic substance, does not exist between adjacent first patterned electrodes, the advantage of the present invention is offered irrespective of whether the inorganic solid layer exists under the first patterned electrodes. In other words, an organic EL display device, which includes a first set of transparent electrodes on a substrate, a second set of electrodes provided on a side of the first set of electrodes remote from the substrate, a light emitting layer formed so as to be located between a layer of the first set of electrodes and a layer of the second set of electrodes, and an organic layer is formed between the layer of the first set of electrodes and the substrate, and wherein an inorganic solid layer, which is capable of preventing water or an organic substance from passing in an interlayer direction, does not exist under the first patterned electrode or between adjacent patterned electrode, is also included in the category of the organic EL display device according to the present invention.

EXAMPLES

Now, examples of the present invention and comparative examples will be described in detail. Examples 1, 2, 3, 6, 7, 8, 9, 10, 11 and 12 are examples of the present invention, and Examples 4 and 5 are comparative examples.

Example 1

Color filters having a thickness of 1.5 μm were formed on a glass substrate by photolithography. An overcoat layer, which comprised an acryl resin provided on a glass substrate base and having a thickness of 2 μm, was formed by photolithography. An inorganic solid layer, which had a thickness of 20 nm and is made of $SiO_2$, was formed by sputtering. An ITO film as a layer of the first set of electrodes was deposited so as to have a thickness 150 nm by sputtering. The inorganic solid layer of $SiO_2$ was deposited by RF sputtering under such conditions that the substrate temperature was 220° C., $SiO_2$ was employed as the target, an argon gas was employed as the sputtering gas, and the gas pressure is 0.7 Pa. The ITO film was deposited by DC sputtering under such conditions that the substrate temperature was 220° C., an argon gas with 0.8% of oxygen gas added was employed as the sputtering gas, and the gas pressure was 0.7 Pa.

Then, the first set of electrodes (anodes) made of ITO was patterned by wet etching, using a solution of hydrochloric acid and ferric chloride. By this treatment, the portions of the inorganic solid layer made of $SiO_2$ between adjacent first patterned electrodes were exposed. The width of each of the first patterned electrodes was set at 320 μm, and the width of the exposed portions of the inorganic solid layer of $SiO_2$ between adjacent patterned electrodes was set at 30 μm.

Next, the exposed portions of the inorganic solid layer of $SiO_2$ between adjacent first patterned electrodes were wet etched by dilute hydrofluoric acid. Since the overcoat layer was not wet etched by dilute hydrofluoric acid, etching was performed only to the inorganic solid layer of $SiO_2$. By this treatment, the portions of the overcoat layer between adjacent first patterned electrodes were exposed, and a structure wherein the portions of the inorganic solid layer did not substantially exist between adjacent first patterned electrodes was obtained a shown in FIG. 8B.

On this structure, an insulating layer, which had apertural areas and was made of photosensitive polyimide, was formed by photolithography. Cathode separator, which were made of a cresol resin, were formed as an upper layer. The apertural areas of the insulating layer had an apertural width in a width direction of the first patterned electrodes set at 300 μm. Additionally, a light emitting element layer was formed by vapor deposition of copper phthalocyanine having a thickness of 10 nm, α-NPD (4,4'-bis[N-(1-naphthyl)-N-phenylamino]biphenyl) having a thickness of 100 nm and Alq3 (tris(8-quinolinorate)aluminum) having a thickness of 60 nm. On the light emitting element layer, a film of LiF having a thickness of 0.5 nm and Al electrodes having a thickness of 80 nm were deposited by a vapor deposition method to form an electron injection layer and cathodes (second set of electrodes).

Figure 9:
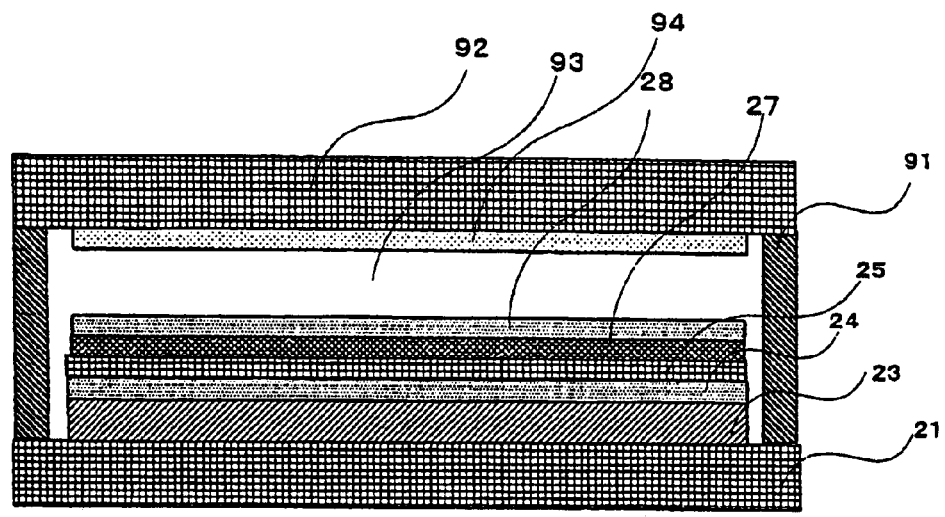
FIG. 9 is a schematic cross-sectional view of the organic EL display device according to an example of the present invention.

As shown in FIG. 9, the organic EL display device was completed by providing a seal 91 manufactured by Three Bond Co., Ltd. and an opposed substrate 92 made of glass with a desiccant 94 manufactured by Saes Getters Co., Ltd. being affixed thereon, sealing a dry nitrogen gas in a space 93, and sealingly encapsulating the active area in a layered structure, which comprised the substrate 21, the color filters 22, the overcoat layer 23, the inorganic solid layer 24, the first set of electrodes 25, the insulating layer 26, the light emitting layer 27 and the second set of electrodes 28. In FIG. 9, the patterned portions of the color filters, the insulating layer, and the inorganic solid layer are omitted.

The drying treatment was performed at a temperature of 200° C. under vacuum for 1 hour after formation of the cathode separator. Additionally, the drying treatment was performed at a temperature of 200° C. for 10 minutes in a dry nitrogen atmosphere having a dew point of about −80° C. just before vapor deposition of the light emitting element layer. The vapor deposition of the light emitting layer was performed under vacuum without contact with atmospheric air during the process from the drying step to the deposition step. The sealing treatment was performed by using the seal in an atmosphere of a dry nitrogen gas.

Figure 10:
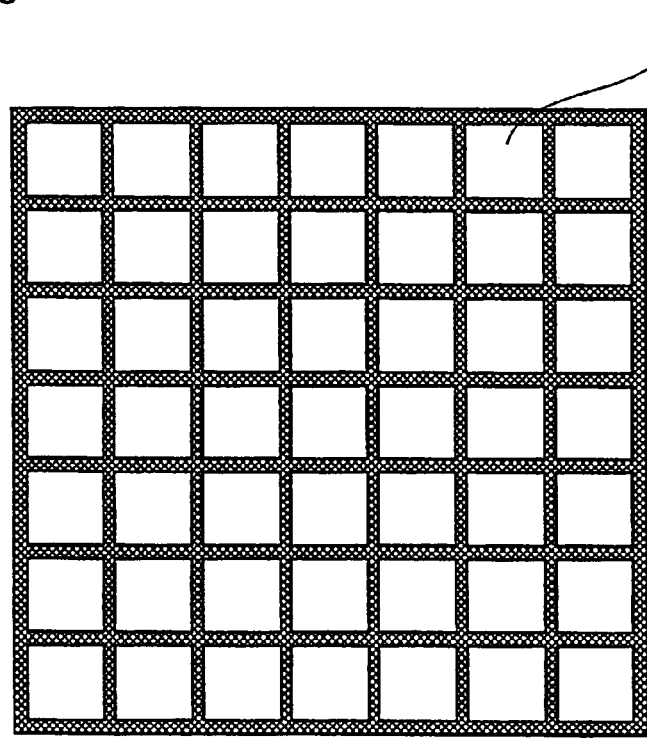
FIG. 10 is a schematic plan view of the organic EL display device according to the example of the present invention.

After the organic EL display device was stored at a temperature of 105° C. for 24 hours, the apertural areas of the light emitting layer of the organic EL display device were observed. No spot-like non-emissive areas were observed as shown in FIG. 10.

Example 2

This example was performed as in Example 1 except that, instead of the inorganic solid layer made of $SiO_2$ and having a thickness of 20 nm, an inorganic solid layer, which was only different in terms of a thickness of 5 nm and was deposited under the same film deposition conditions as Example 1, was used, the inorganic solid layer made of $SiO_2$ was not subjected to etching by dilute hydrofluoric acid, and that the drying time was changed.

It was supposed that the drying time needed to be extended in comparison with Example 1 since the entire surface of the overcoat layer was covered with the inorganic solid layer made of $SiO_2$ so as to have every portion covered with the inorganic solid layer. For this reason, although the second drying treatment and the sealing treatment were performed as in Example 1, the first drying treatment was performed at a temperature of 200° C. in vacuum for 2 hours.

Evaluation, which was performed as in Example 1, revealed that any spot-like non-emissive portions were not observed.

Example 3

This example was performed as in Example 1 except that, instead of the inorganic solid layer made of $SiO_2$ and having a thickness of 20 nm, an inorganic solid layer, which comprised a layer made of $SiO_2$ and having a thickness of 20 nm and a layer made of $ZrO_2$, having a thickness of 5 nm and layered thereon, was used, the layered portions were collectively etched by dry etching using a gas mixture of $CF_4$ and $O_2$.

Although portions of the overcoat layer were also etched to a depth of about 1 μm as shown in FIG. 6, there was no trouble with respect to layer formation on the etched portions since the etched portions were filled with the insulating layer.

Although it was supposed that the drying time was able to be shortened in comparison with Example 1 since the dry etching treatment was adopted and since the overcoat layer was only partly etched, the drying treatments and the sealing treatment were performed as in Example 1.

Evaluation, which was performed as in Example 1, revealed that any spot-like non-emissive portions were not observed.

Example 4

This example was performed as in Example 1 except that the inorganic solid layer was not subjected to etching by dilute hydrofluoric acid, and that the drying treatments and the sealing treatment were performed as in Example 2.

Evaluation, which was performed as in Example 1, revealed that spot-like non-emissive portions were observed as shown in FIG. 1.

Example 5

This example was performed as in Example 1 except that, instead of the inorganic solid layer made of $SiO_2$ and having a thickness of 20 nm, an inorganic solid layer, which comprised a layer made of $SiO_2$ and having a thickness of 20 nm and a layer made of SiN, having a thickness of 200 nm and layered thereon, was used, the inorganic solid layer made of $SiO_2$ was not subjected to etching by dilute hydrofluoric acid, and that the drying treatments and the sealing treatment were performed as in Example 2.

Evaluation, which was performed as in Example 1, revealed that nearly half as many spot-like non-emissive portions as the non-emissive portions in Example 4 were observed.

Example 6

The treatments up to fabrication of the first patterned electrodes made of ITO by etching using a liquid mixture of hydrochloric acid and a solution of ferric chloride to expose the portions of the inorganic solid layer of $SiO_2$ between adjacent patterned electrodes are performed as in Example 1. Then, the surface of the ITO film is flattened by polishing. At this time, it is sufficient that the film thickness of the ITO film is reduced by about 15 nm.

The film thickness of the portions of the inorganic solid layer of $SiO_2$ between adjacent ITO patterns is also reduced to about 5 nm by a decrease of about 15 nm. The subsequent processes may be performed as in Example 1. The dry treatments before vapor deposition, and the sealing treatment may be performed as in Example 1.

Example 7

This example was performed as in Example 1 except following conditions as below.

An inorganic solid layer was used, being comprised of a $ZrO_2$ layer with 2.5 nm thickness on a $SiO_2$ layer with 2.5 nm thickness, which was deposited under the same conditions as Example 1 instead of a $SiO_2$ layer of 20 nm thickness.

The $SiO_2$ inorganic solid layer was not subjected to etching by dilute hydrofluoric acid and the drying time was changed.

Evaluation, which was performed as in Example 1, revealed that any spot-like non-emissive portions were not observed.

Example 8

This example was performed as in Example 2 except that the thickness of the color filters was set at 1.2 μm, the overcoat layer was formed so as to have a thickness of 1.5 μm, the pattern width of the first electrodes was set at 70 μm, the width of the exposed portions of the inorganic solid layer of $SiO_2$ between adjacent patterned electrodes was set at 20 μm, the apertural width of the insulation layer was set at 60 μm, and the light emitting layer was replaced by a white light emitting element layer having a total film thickness of 140 nm.

Evaluation, which was performed as in Example 1, revealed that any spot-like non-emissive portions were not observed.

Example 9

This example was performed as in Example 8 except that after formation of the cathode separator and the washing treatment, the drying treatment was performed at a temperature of 200° C. for 60 min in a dry nitrogen atmosphere having a dew point of about −80° C., and that the light emitting element layer was formed by vapor deposition without contact with atmospheric air.

Evaluation, which was performed as in Example 1, revealed that any spot-like non-emissive portions were not observed.

Example 10

This example was performed as in Example 9 except that after formation of the cathode separator and the washing treatment, the drying treatment was changed to be performed at a temperature of 200° C. for 60 min in a dry an atmosphere having a dew point of about −50° C.

Evaluation, which was performed as in Example 1, revealed that any spot-like non-emissive portions were not observed.

Example 11

This example was performed as in Example 8 except that after formation of the cathode separator and the washing treatment, a heating drying treatment was performed at a temperature of 200° C. for 1 hour in vacuum with subsequent cooling to room temperature in vacuum, and that the light emitting element layer was formed by vapor deposition after being passed through atmospheric air. In this case, the atmospheric air had a temperature of 23° C. and a humidity of about 50% RH, and the residence time in the atmospheric air was about 5 min.

Evaluation, which was performed as in Example 1, revealed that any spot-like non-emissive portions were not observed. However, when examined microscopically how light was emitted, each of the pixels had a non-emissive portion formed in a width of about 3 μm on a portion of the relevant first electrode close to an end thereof in common with other pixels.

When examined microscopically how light was emitted in Examples 1, 2, 3, 6, 7, 8, 9 and 10, any non-emissive portions were not observed.

Example 12

This example was performed as in Example 8 except that after formation of the cathode separator and the washing treatment, the light emitting element layer was formed by vapor deposition without performing any heating treatment or other treatment.

Evaluation, which was performed as in Example 1, revealed that any spot-like non-emissive portions were not observed. However, when examined microscopically how light was emitted, each of the pixels had a non-emissive portion formed in a width of about 12 μm on a portion of the relevant first electrode close to an end thereof in common with other pixels. Although it was microscopically seen that the light emitting part of each of the pixels was quite thinned, neither chrominance non-uniformity, stain nor the like was observed as viewing the entire screen with the naked eye. It is supposed that the pixels were uniformly contracted over the entire screen.

The present divisional application claims the benefit of priority under 35 U.S.C. §120 to application Ser. No. 10/900,080, filed on Jul. 28, 2004, and under 35 U.S.C. §119 from Japanese Patent Application No. 2003-282344 filed on Jul. 30, 2003, Japanese Patent Application No. 2003-398762 filed on Nov. 28, 2003 and Japanese Patent Application No. 2004-162506 filed on May 31, 2004, the entire contents of each of which are incorporated herein by reference.

What is claimed is:

1. A method for fabricating an organic EL display device, comprising:
    providing an organic layer on a substrate, wherein the organic layer includes water or an organic solvent;
    providing an inorganic solid layer on the organic layer;
    providing a first set of transparent electrodes on the inorganic solid layer;
    providing an organic light emitting layer on the first set of electrodes;
    providing a second set of electrodes on the organic light emitting layer provided on the first set of electrodes; and
    removing the water or the organic solvent in the organic layer through routes in the inorganic solid layer for moisture passage by drying the organic layer before providing the organic light emitting layer, the routes for moisture passage being substantially uniformly provided in regions of the inorganic solid layer that are between adjacent electrodes of the first set.

2. The method according to claim 1, further comprising forming the inorganic solid layer so as to have a layer thickness from 1 to 5 nm when providing the inorganic solid layer.

3. The method according to claim 2, further comprising forming the inorganic solid layer at a substrate temperature of 100° C. or below when providing the inorganic solid layer.

4. The method according to claim 1, further comprising forming the inorganic solid layer at a substrate temperature of 200° C. or above when providing the inorganic solid layer.

5. The method according to claim 1, further comprising removing at least one part of portions of the inorganic solid layer in the regions between adjacent electrodes of the first set before providing of the organic light emitting layer.

6. A method for fabricating an organic EL display device, which includes a plurality of pixels corresponding to an organic light emitting layer provided between sets of electrodes, comprising:
    providing an organic layer on a substrate, wherein the organic layer includes water or an organic solvent;
    providing an inorganic solid layer on the organic layer;
    providing a first set of transparent electrodes provided on the inorganic solid layer;
    providing an organic light emitting layer on the first set of electrodes;
    providing a second set of electrodes formed on the organic light emitting layer provided on the first set of electrodes; and
    removing the water or the organic solvent in the organic layer through routes for moisture passage by drying the organic layer before providing the organic light emitting layer and after providing the inorganic solid layer, the routes for moisture passage being provided in regions between adjacent electrodes of the first set.

7. A method for fabricating an organic EL display device, comprising:
    providing an organic layer on a substrate, wherein the organic layer includes water or an organic solvent;
    providing an inorganic solid layer on the organic layer;
    providing a first set of transparent electrodes on the inorganic solid layer;
    providing an organic light emitting layer on the first set of electrodes; and
    providing a second set of electrodes on the organic light emitting layer provided on the first set of electrodes;
    and further comprising:
    removing the water or the organic solvent in the organic layer through routes for moisture passage by drying the substrate before providing the organic light emitting layer, the routes for moisture passage being provided in the inorganic solid layer; and
    forming the inorganic solid layer so as to have a layer thickness set at such a thickness that allows the routes for moisture passage to be formed therein in order to avoid visible failure when providing of the organic light emitting layer.

* * * * *